(12) United States Patent
Tjaden, Jr. et al.

(10) Patent No.: US 10,697,810 B1
(45) Date of Patent: Jun. 30, 2020

(54) SENSOR HOUSING ASSEMBLY

(71) Applicant: Dickson/Unigage, Inc., Addison, IL (US)

(72) Inventors: Dean A. Tjaden, Jr., Elgin, IL (US); Denise A. Alexander, Naperville, IL (US); Steven J. Thompson, Aurora, IL (US); James D. Springer, Lyons, IL (US)

(73) Assignee: Dickson/Unigage, Inc., Addison, IL (US)

( * ) Notice: Subject to any disclaimer, the term of this patent is extended or adjusted under 35 U.S.C. 154(b) by 8 days.

(21) Appl. No.: 16/032,760

(22) Filed: Jul. 11, 2018

(51) Int. Cl.
| | |
|---|---|
| *G01D 21/00* | (2006.01) |
| *G01D 11/24* | (2006.01) |
| *G01N 27/12* | (2006.01) |
| *G01L 19/00* | (2006.01) |
| *G01K 1/14* | (2006.01) |
| *H05K 1/18* | (2006.01) |

(52) U.S. Cl.
CPC ........... *G01D 11/245* (2013.01); *G01D 21/00* (2013.01); *G01K 1/14* (2013.01); *G01L 19/0084* (2013.01); *G01N 27/121* (2013.01); *H05K 1/18* (2013.01)

(58) Field of Classification Search
CPC .............................. G01D 11/245; G01D 21/00
See application file for complete search history.

(56) References Cited

U.S. PATENT DOCUMENTS

2009/0016685 A1* 1/2009 Hudgins ................ H04B 10/40
385/92
2010/0307223 A1* 12/2010 Jeftic-Stojanovski ........................
A42B 3/046
73/12.04
2011/0277547 A1* 11/2011 Duncan ................ G01N 27/048
73/335.02
2011/0290018 A1* 12/2011 Jeftic-Stojanovski ........................
A42B 3/046
73/493
2011/0320130 A1* 12/2011 Valdes ................ G06F 19/3418
702/19
2012/0083705 A1*  4/2012 Yuen .................... A61B 5/0002
600/508
2013/0274576 A1* 10/2013 Amirouche ......... A61M 5/1408
600/365

(Continued)

OTHER PUBLICATIONS

Multi Pod Sensor Drawing; Prior Art by Applicant Dickson; Dec. 10, 2013.

(Continued)

*Primary Examiner* — Jamel E Williams
(74) *Attorney, Agent, or Firm* — Neustel Law Offices

(57) ABSTRACT

A sensor housing assembly for enclosing an electrical interface circuit, a sensor or sensor input, and a connector for interfacing with a data unit. The sensor housing assembly generally includes a housing containing a circuit board and interface circuitry to condition a sensor input signal, and a connector mounted on the circuit board, the assembly being insertable into a data unit. The housing can include a protrusion that prevents the assembly from being inserted into the data unit incorrectly, which also allows a symmetrical connector to be used. The sensor housing assembly is adapted to be inserted into a receptacle in the data unit, which has blocking tabs that act with the protrusion to ensure that the assembly can only be inserted one way.

7 Claims, 6 Drawing Sheets

(56) References Cited

U.S. PATENT DOCUMENTS

| | | | | |
|---|---|---|---|---|
| 2015/0355012 | A1* | 12/2015 | Gurumohan | A47G 19/00 |
| | | | | 702/55 |
| 2017/0119918 | A1* | 5/2017 | Lima | A61L 9/035 |
| 2017/0181698 | A1* | 6/2017 | Wiedenhoefer | A61B 5/4851 |
| 2017/0248455 | A1* | 8/2017 | Miki | G01F 1/684 |
| 2018/0295895 | A1* | 10/2018 | Donohoe | A41D 1/002 |
| 2019/0056304 | A1* | 2/2019 | Gershtein | G01N 15/1404 |
| 2019/0208954 | A1* | 7/2019 | van Dorp | A47J 36/2433 |
| 2019/0257802 | A1* | 8/2019 | Forzani | A61B 5/0022 |

OTHER PUBLICATIONS

Platinum RTD Replaceable Sensor Drawings; Prior Art by Applicant Dickson; May 27, 2017.

Replaceable Sensor 2 Channel T/C Drawings; Prior Art by Applicant Dickson; Dec. 26, 2016.

Replaceable Sensor 2 Channel Thermistor Drawing; Prior Art by Applicant Dickson; Dec. 26, 2016.

Replaceable Sensor Temp/Humidity Drawings; Prior Art by Applicant Dickson; Dec. 26, 2016.

Replaceable Sensor Thermistor Drawings; Prior Art by Applicant Dickson; Dec. 26, 2016.

Replaceable Sensor Thermocouple Drawings; Prior Art by Applicant Dickson; Dec. 26, 2016.

Temp/Humidity Pod Drawings; Prior Art by Applicant Dickson; Mar. 23, 2013.

Thermistor Pod Drawing; Prior Art by Applicant Dickson; Dec. 10, 2013.

Thermocouple Pod Drawing; Prior Art by Applicant Dickson; Dec. 10, 2013.

* cited by examiner

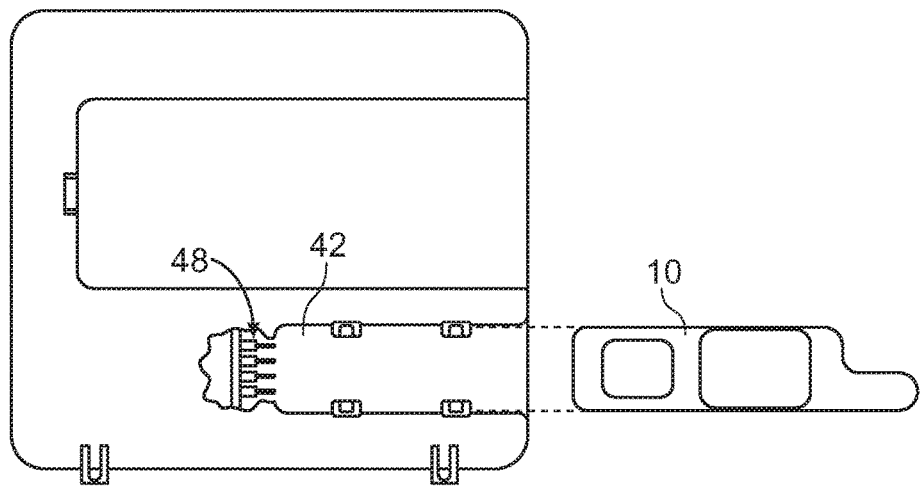
FIG. 10A
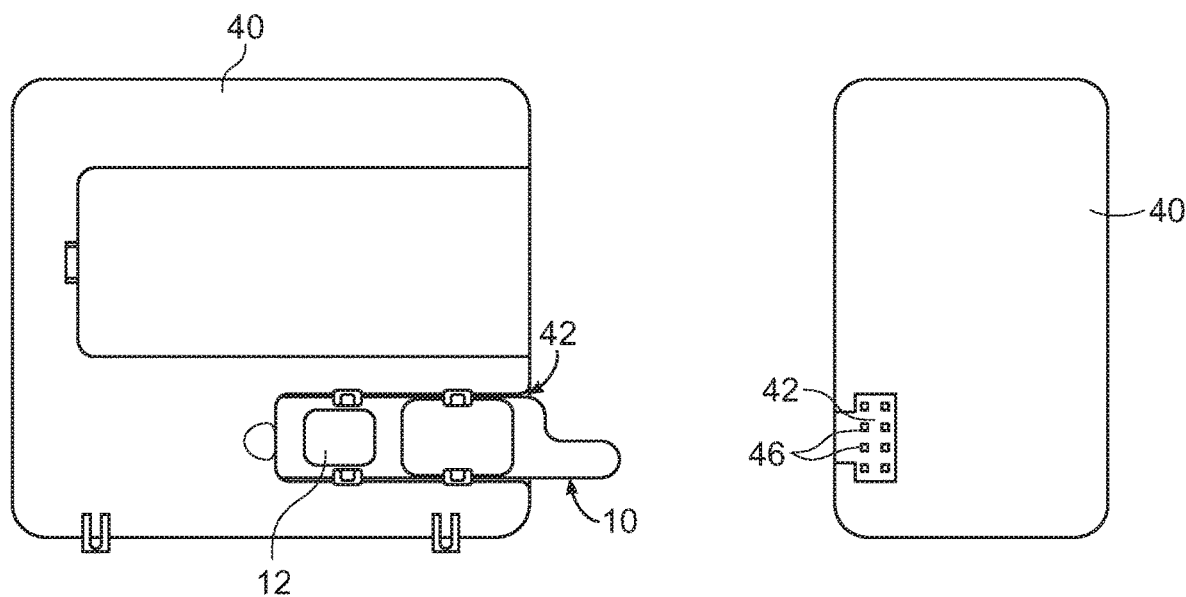 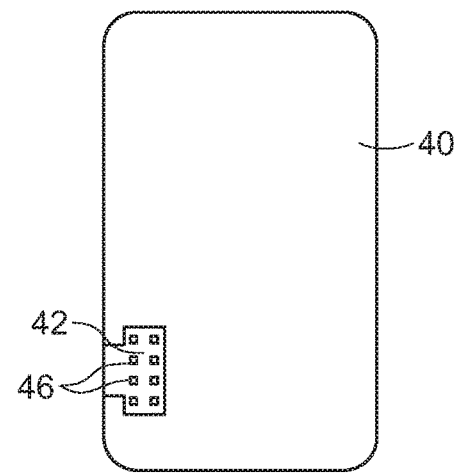
FIG. 10B  FIG. 10C

SENSOR HOUSING ASSEMBLY

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND

Field

Example embodiments in general relate to a sensor housing assembly for containing or enclosing an electrical interface circuit, a connector, and a sensor, the housing assembly insertable into a data unit.

Related Art

Any discussion of the related art throughout the specification should in no way be considered as an admission that such related art is widely known or forms part of common general knowledge in the field.

Electrical sensors for sensing variables such as temperature, pressure, differential pressure, pH, and humidity have been used in a number of industries. As just one example, temperature sensors and associated systems have been used for many years to test components or background conditions in a number of industries. Such sensors typically produce an electrical signal or characteristic (e.g., voltage, current, or impedance) that corresponds to the measured variable, usually in a proportional way. For example, a thermocouple produces a voltage output that corresponds to the temperature at the measuring point. Resistance-based temperature measurements are also known.

Replaceable sensors may include not only the sensing element (or elements) itself, but also associated circuitry needed to convert the raw signal to an accurate signal or data that directly represents the measured variable. Replaceable sensors may also include a connector or interface for plugging into a data unit, such as a data logger or display.

Such replaceable sensors need rugged housings that are interchangeable, that can be plugged directly into data units (such as displays or data loggers) without worry about the wrong orientation, and without using special connector arrangements that ensure correct insertion.

SUMMARY

An example embodiment is directed to a sensor housing assembly, which may comprise a replaceable sensor assembly that contains electrical interface circuitry that allows the replaceable sensor to include its own calibration information, so that replacing an entire sensor assembly is all that is needed to maintain overall calibration of a system. The sensor housing assembly is adapted for insertion into a data unit's receptacle, the assembly comprising a circuit board having an electrical interface circuit that accepts a sensor signal and generates an output corresponding to the sensor signal. The example embodiment may also include a connector mounted on the circuit board and conductively coupled to the output, the connector comprising a first plurality of conductive elements. The embodiment may further include a housing substantially enclosing the circuit board, the housing comprising a first elongated side and a second elongated side opposite the first elongated side, the housing further comprising a first opening at a first end adapted to allow the connector to be mated to a complementary connector of the data unit, the complementary connector having a second plurality of conductive elements configured to mate with the first plurality of conductive elements.

The first elongated side is adapted to contact a surface of the data unit receptacle, and the second elongated side may include a protrusion to prevent the housing from being inserted incorrectly, with the second elongated side adjacent to the surface.

In another example embodiment, the first elongated side and the second elongated side may be parallel to each other. In addition, the housing can surround the connector on four sides.

In still another example embodiment, the sensor housing assembly can further comprise a sensor mounted on the circuit board.

In a further example embodiment, the connector of the sensor housing assembly may comprise a symmetrical arrangement of conductive elements. For example, the first plurality of conductive elements may be symmetrically arranged, and may also all be female, although other configurations (e.g., part male, part female) are also possible.

In another example embodiment, the protrusion of the sensor housing may comprise a curved surface, and more specifically, may comprise a cylindrically-shaped surface.

In some example embodiments, the sensor housing assembly may comprise a temperature sensor or a pressure sensor. In another example, the sensor may comprise multiple sensors, such as a temperature sensor and a humidity sensor. The sensors can be mounted directly on the circuit board, or they may be external to the housing. If they are mounted on the circuit board, the housing may include one or more ambient openings near the sensor, so that ambient conditions such as pressure, temperature, and humidity can be sensed. For temperature readings, the sensor may be a thermocouple, a thermistor, an RTD, etc.

If the sensor is not mounted on the circuit board directly, the housing may have a second opening, generally (but not necessarily) opposite the first opening for receiving an input. Such an input may, for example, be a voltage or current signal carried on a wire, and may be proportional to, or correspond to, a measured variable.

In another example embodiment, the input may comprise a tube for carrying a pressure to a pressure sensor mounted on the circuit board, and the tube may enter the housing at the second opening.

There has thus been outlined, rather broadly, some of the embodiments of the sensor housing assembly in order that the detailed description thereof may be better understood, and in order that the present contribution to the art may be better appreciated. There are additional embodiments of the sensor housing assembly that will be described hereinafter and that will form the subject matter of the claims appended hereto. In this respect, before explaining at least one embodiment of the sensor housing assembly in detail, it is to be understood that the sensor housing assembly is not limited in its application to the details of construction or to the arrangements of the components set forth in the following description or illustrated in the drawings. The sensor housing assembly is capable of other embodiments and of being practiced and carried out in various ways. Also, it is to be understood that the phraseology and terminology employed herein are for the purpose of the description and should not be regarded as limiting.

BRIEF DESCRIPTION OF THE DRAWINGS

Example embodiments will become more fully understood from the detailed description given herein below and the accompanying drawings, wherein like elements are represented by like reference characters, which are given by way of illustration only and thus are not limitative of the example embodiments herein.

FIG. 10A is a rear view of a data unit with a replaceable sensor in position to be installed, in accordance with an example embodiment.

FIG. 10B is a rear view of a data unit with a replaceable sensor installed, in accordance with an example embodiment.

FIG. 10C is a side view of a data unit showing a receptacle for a replaceable sensor, in accordance with an example embodiment.

DETAILED DESCRIPTION

A. Overview

Figure 1:
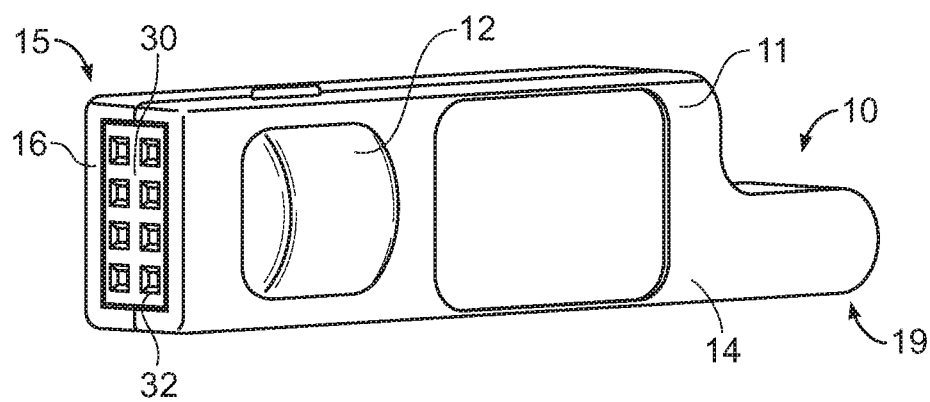
FIG. 1 is a perspective view of a replaceable sensor, in accordance with an example embodiment.

An example sensor housing assembly 10 adapted for insertion into a data unit receptacle 42 generally comprises a housing 11 adapted for insertion into a data unit receptacle, a circuit board 20 comprising an electrical interface circuit 22 that accepts a sensor signal and generates an output proportional to, or corresponding to, the sensor signal.

The sensor signal may come from a sensor 26 such as a temperature sensor or a pressure sensor. In another example embodiment, the sensor 26 may comprise multiple sensors, such as a temperature sensor and a humidity sensor. If the sensor 26 is a temperature sensor, it may be a thermocouple, a thermistor, an RTD, or virtually any other type of temperature sensor capable of creating an electrical signal proportional to, or corresponding to, temperature.

The sensor 26 may be mounted directly on the circuit board 20, or alternatively may be a remote sensor (such as a thermocouple) with a wire or connector to carry the sensor signal into the housing 11 for coupling onto the circuit board 20. Where the sensor is mounted directly on the circuit board 20, the housing may include one or more ambient openings 18 for exposing the sensor 26 or sensors 26 to ambient conditions, such as temperature, pressure, or humidity.

For a remote sensor, the housing 11 may comprise a second opening 17 at a second end 19 for receiving the sensor input. Rather than carry a signal on a wire, the second opening in the housing may be used to allow a tube 60 to enter the housing. One end of the tube 60 may be exposed to a pressure, while the other end may enter the housing 11 for attachment to a pressure sensor 26 mounted on the circuit board 20.

The example embodiment may also include a connector 30 mounted on the circuit board 20 and conductively coupled to the output, the connector 30 comprising a first plurality of conductive elements 32.

The housing 11 may substantially enclose the circuit board 20, and the housing 11 may also comprise a first elongated side 13 and a second elongated side 14 opposite the first elongated side 13, the housing further comprising a first opening 16 at a first end 15 adapted to allow the connector 30 to be mated to a complementary connector 48 of the data unit 40, the complementary connector 48 having a second plurality of conductive elements 46 configured to mate with the first plurality of conductive elements 32.

The first elongated side 13 of the housing 11 is adapted to contact a surface of the receptacle 42 in the data unit 40 and wherein the second elongated side 14 includes a protrusion 12 to prevent the housing from being inserted with the second elongated side 14 adjacent to the surface. The protrusion 12 may comprise a curved surface, and further, may also include a cylindrically-shaped surface.

In an example embodiment, the first elongated side 13 and the second elongated side 14 are parallel to each other, although this arrangement is not necessary to the functioning of the example embodiments. In a further embodiment, the housing 11 surrounds the connector 30 on four sides, securing it within the housing assembly. An example embodiment can further comprise a sensor 26 mounted directly on the circuit board 20 at or near the second end 19 of the housing 11.

The first plurality of conductive elements 32 may be symmetrically arranged—that is, if the housing's orientation were not dictated by the protrusion 12, the connector 30 (which carries the conductive elements) could readily be inserted upside-down, due to the symmetry. The first plurality of conductive elements 32 may all be of one type, such as female elements. A symmetrical arrangement is possible because the direction of insertion of the housing 11 into the receptacle 42 is dictated by the protrusion 12, rather than by any particular arrangement of connector elements.

B. Housing

Figure 2:
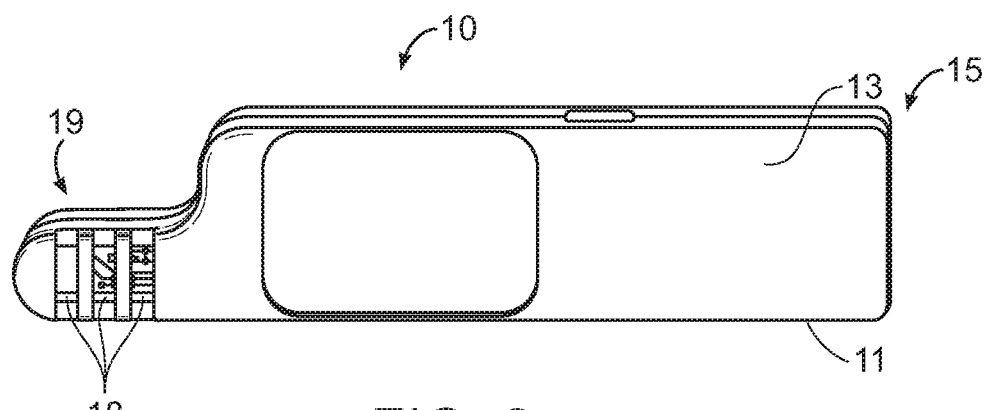
FIG. 2 is an alternate perspective view of a replaceable sensor, in accordance with an example embodiment.
Figure 4:
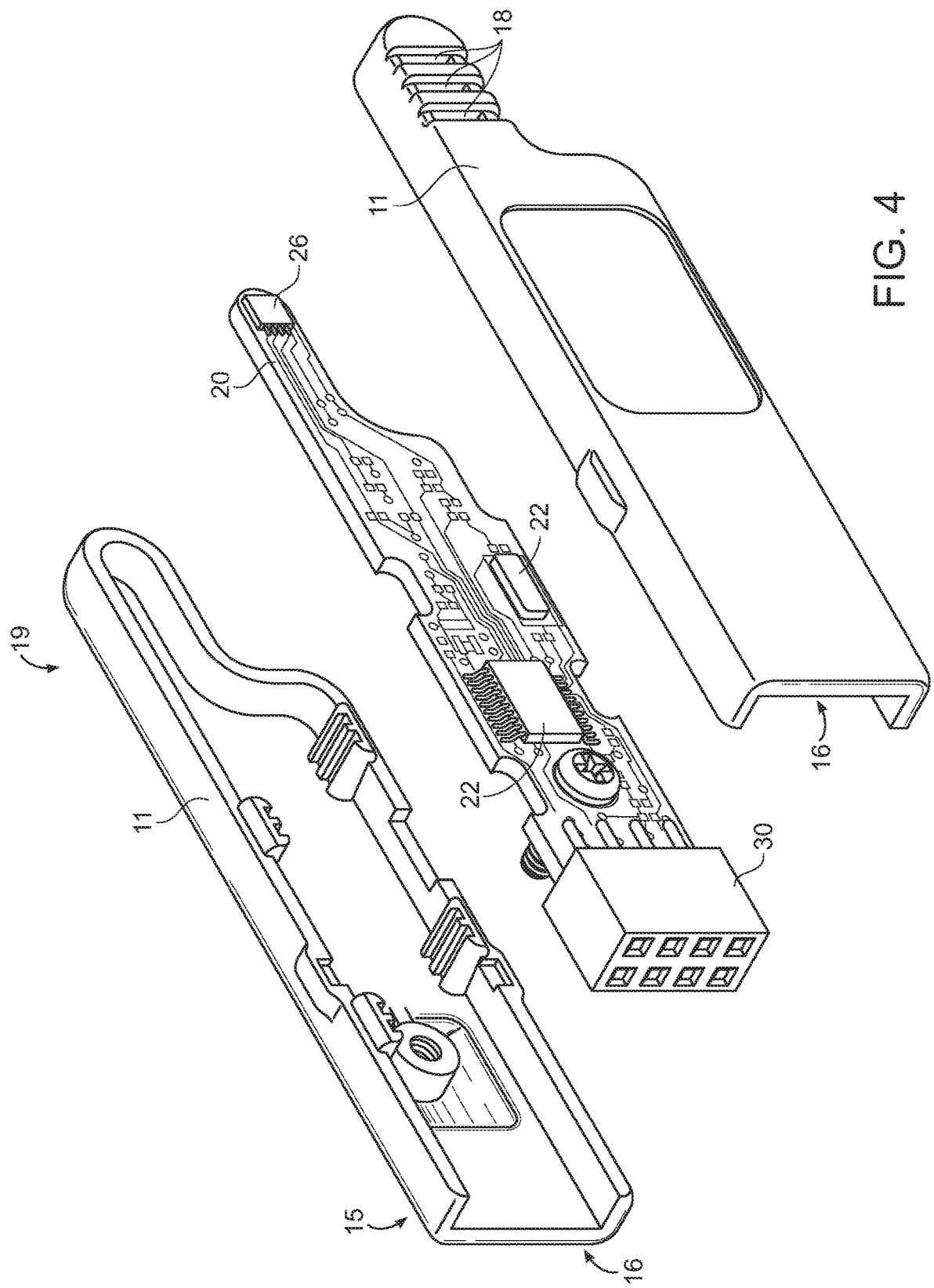
FIG. 4 is an exploded view of a replaceable sensor, in accordance with an example embodiment.
Figure 5:
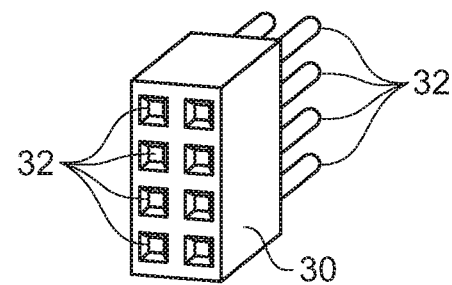
FIG. 5 is a perspective view perspective view of a connector for use with a replaceable sensor, in accordance with an example embodiment.

As best shown in FIGS. 1, 2 and 4, the sensor housing assembly 10 may comprise a housing 11 that substantially encloses a circuit board 20. The replaceable housing assembly 10 and all its components comprise a replaceable sensor that is made for insertion into a receptacle 42 in a data unit 40. The circuit board 20 typically includes a sensor 26, or an input for a sensor signal in the same general location as sensor 26. As shown in FIG. 4, the housing 11 may comprise two halves 11a and 11b that snap together, although other means of joining the halves are also possible, such as ultrasonic welding, glue, screws, etc. As is well known, the housing halves 11a and 11b may snap together with tabs (such as shown on half 11b) that fit into mating slots in the other housing half, such as slots on half 11a.

Figure 3:
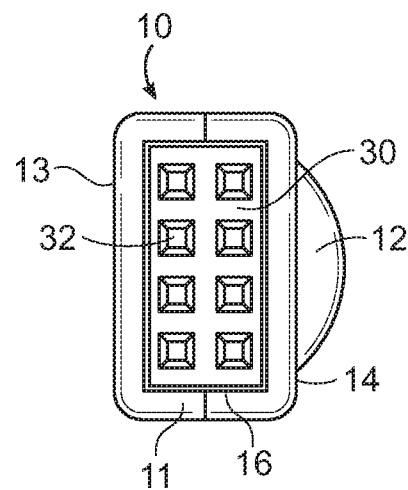
FIG. 3 is an end view of a replaceable sensor, in accordance with an example embodiment.

As shown in FIGS. 1-3, the housing may typically have two elongated sides, such as first side 13 and second side 14. As shown in FIGS. 1 and 3, one side of the housing includes a protrusion 12. Protrusion 12 prevents the housing from being inserted backwards, for example, with first side 13 facing out rather than against the inner surface 43 of receptacle 42 as shown in FIG. 10B.

In addition to the elongated sides, the housing has a first end 15 and a second end 19. As shown in FIG. 1, the housing also comprises a first opening 16 at first end 15, wherein the first opening 16 allows access to a connector 30, as described in further detail below. In addition, several embodiments of the housing are possible regarding the second end 19. One embodiment is as shown in FIG. 1, in which the second end 19 includes an extension, beneath which is a sensor 26 mounted directly on circuit board 20. In this embodiment, the housing 11 will typically include ambient openings 18 to expose the sensor 26 to one or more ambient conditions, such as temperature, pressure, or humidity.

Figure 7A:
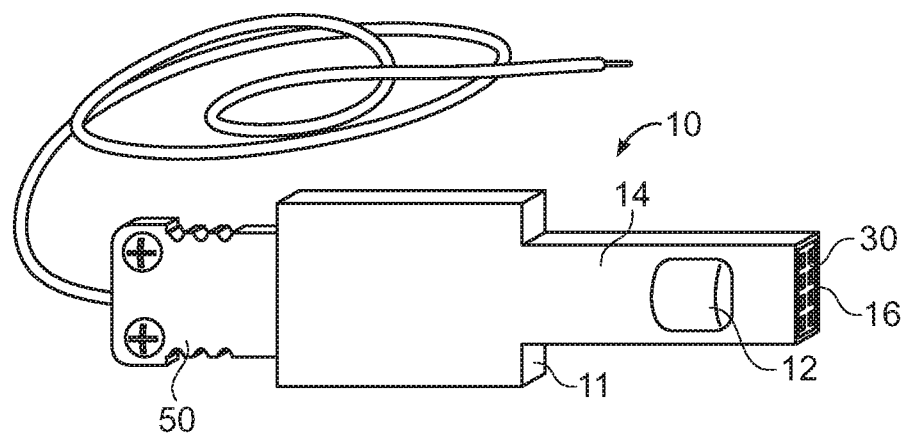
FIG. 7A is a perspective view of an alternative embodiment of a replaceable sensor with a remote sensing element, in accordance with an example embodiment.
Figure 7B:
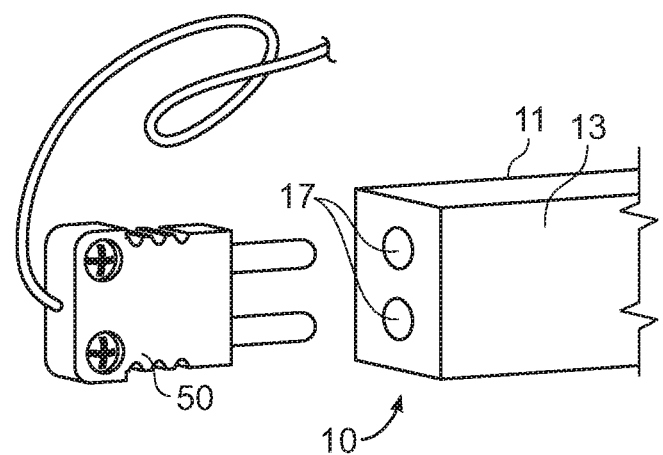
FIG. 7B is an alternate perspective view of a replaceable sensor with a remote sensing element, in accordance with an example embodiment.

In another embodiment, housing 11 may have one or more openings for wires or connector elements at the second end 19, as shown in FIGS. 7A, 7B, 8A, and 8B. For example, as shown in FIGS. 7A and 7B, the housing 11 includes receptacles for a thermocouple connector. Of course, other types of sensors are possible, such as remote pressure, humidity, or differential pressure. In addition, although only one thermocouple input is shown in FIGS. 7A and 7B, multiple inputs are also possible.

Figure 8A:
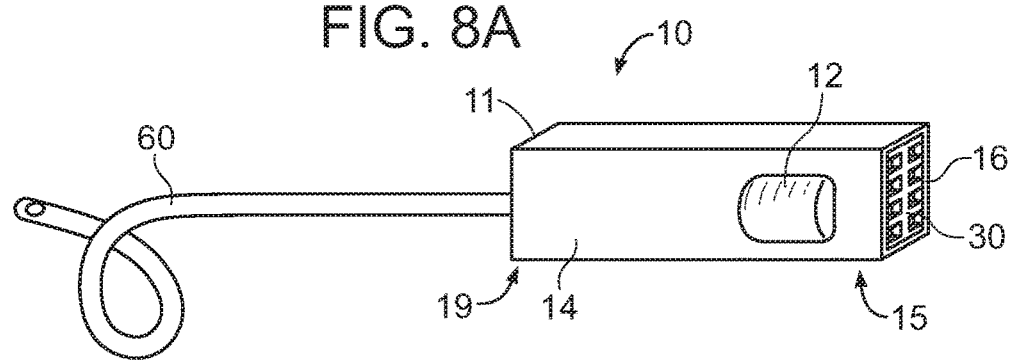
FIG. 8A is a perspective view of an alternative embodiment of a replaceable sensor with a pressure tube, in accordance with an example embodiment.
Figure 8B:
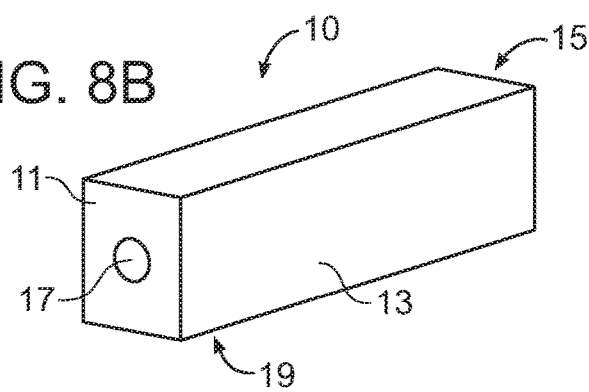
FIG. 8B is another perspective view of an alternative embodiment of a replaceable sensor with a pressure tube, in accordance with an example embodiment.

FIGS. 8A and 8B illustrate an embodiment wherein a pressure tube 60 enters second opening 17 in the housing 11. The other end of the pressure tube can be placed as desired to measure pressure away from the data unit 40. FIG. 6B shows the other end of the pressure tube as it would be routed into the housing 11 onto a board-mounted pressure sensor 26.

As can be generally seen from the Figures, the housing 11 can have different shapes and sizes, depending on what configuration is needed. However, it is useful for the first end 15, the connector 30, and the protrusion 12 to have a common, consistent configuration so that different sensor assemblies can be used for any number of data units, and as discussed herein, none of the replaceable sensors can be inserted improperly into whatever data unit is used.

C. Circuit Board

Figure 6A:
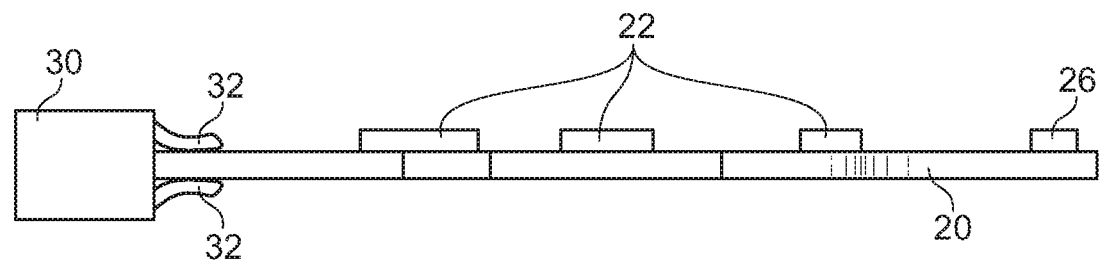
FIG. 6A is a side view of a circuit board of a replaceable sensor with a connector attached, in accordance with an example embodiment.
Figure 6B:
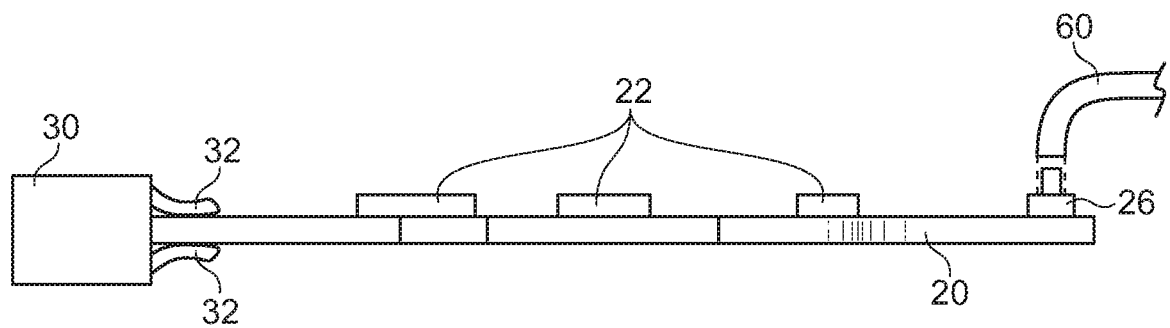
FIG. 6B is a side view of a circuit board of a replaceable sensor with an alternate sensor element, in accordance with an example embodiment.

As best shown in FIGS. 4, 6A, and 6B, the sensor housing assembly 10 may further comprise a circuit board 20 that is enclosed or substantially enclosed within housing 11. The circuit board 20 contains an electrical interface circuit 22. The electrical interface circuit 22 can take a number of forms. Its function is to accept a sensor input, such as an input from sensor 26 mounted on the circuit board or remotely, and it generally comprises electronic circuit components to process signals from one or more sensors and generate one or more output signals that correspond to, or are proportional to, the parameter being measured by sensor 26. For example, if the sensor input comes from a thermocouple, the electrical interface circuit 22 may include circuitry to, among other things, linearize the signal to create an output signal (e.g., digital or analog) that is proportional to, or corresponds to, the temperature being measured.

As shown in FIG. 6A, the circuit board's components that comprise circuit 22 may be surface-mount components mounted on a single side of the circuit board 20, although additional components could be mounted on a second side if necessary. The circuit board may be double sided as may be required to carry a signal or signals to a row of conductive elements, with elements from each of two rows of conductive elements 32 of connector 30 being electrically coupled to circuit board conductors carrying the output signal or signals on each side of the circuit board 20, as shown in FIG. 6A.

As shown in FIG. 4, the circuit board 20 may be secured to housing half 11b by a screw that screws into a standoff element on the inside of the housing half 11b. The circuit board 20 may receive additional support (such as resistance against linear displacement in the direction of insertion into the receptacle 42 of data unit 40) by cutouts that fit within tabs on housing half 11b.

The electrical interface circuit 22 may also include a microprocessor and associated circuitry to take the environmental readings, although simpler interface circuits may also be used. The electrical interface circuit 22 can be calibrated and can store information about the calibration as well as all required information needed for accurate measurement readings. Accordingly, users can eliminate down time since the calibration data is stored on the replaceable sensor system rather than on the data unit. All control of the measurements and communications with the data unit 40 is in the firmware in the microprocessor of interface circuit 22. This allows new replaceable sensors (which include their own interface circuitry and calibration information) to be developed as new sensor types are added to the current models, which can include digital temperature and digital relative humidity, thermistor temperature, thermistor in buffer solution, k-type thermocouple, and platinum RTD temperature. Other measurements and sensor types are also possible.

Regardless of the circuit type employed, the electrical interface circuit 22 provides an output (e.g., an analog or digital signal) that is present on the portion of the circuit board 20 to which the conductive elements of connector 30 are soldered, as shown in FIGS. 4 and 6A. In this manner, the output can be used by the data unit 40 for further processing or display.

D. Data Unit

As best shown in FIGS. 9 and 10A-10C, the replaceable sensor is made for insertion into the receptacle 42 of data unit 40. The receptacle 42 may include blocking tabs 44 that create, in effect, a slot or channel into which the sensor housing assembly 10 fits. As shown in FIG. 10B, the blocking tabs do not extend far enough to reach protrusion 12 of the sensor unit, which will accordingly fit into the receptacle. However, the blocking tabs 44, in conjunction with protrusion 12, prevent the replaceable sensor unit from being inserted incorrectly, with the protrusion 12 facing the inner surface 43 of receptacle 42. This is due to the thickness of the housing 11 including the protrusion 12, which will cause the housing to hit the blocking tabs 44 if a user tries to insert the housing assembly 10 into the data unit backwards.

Figure 9:
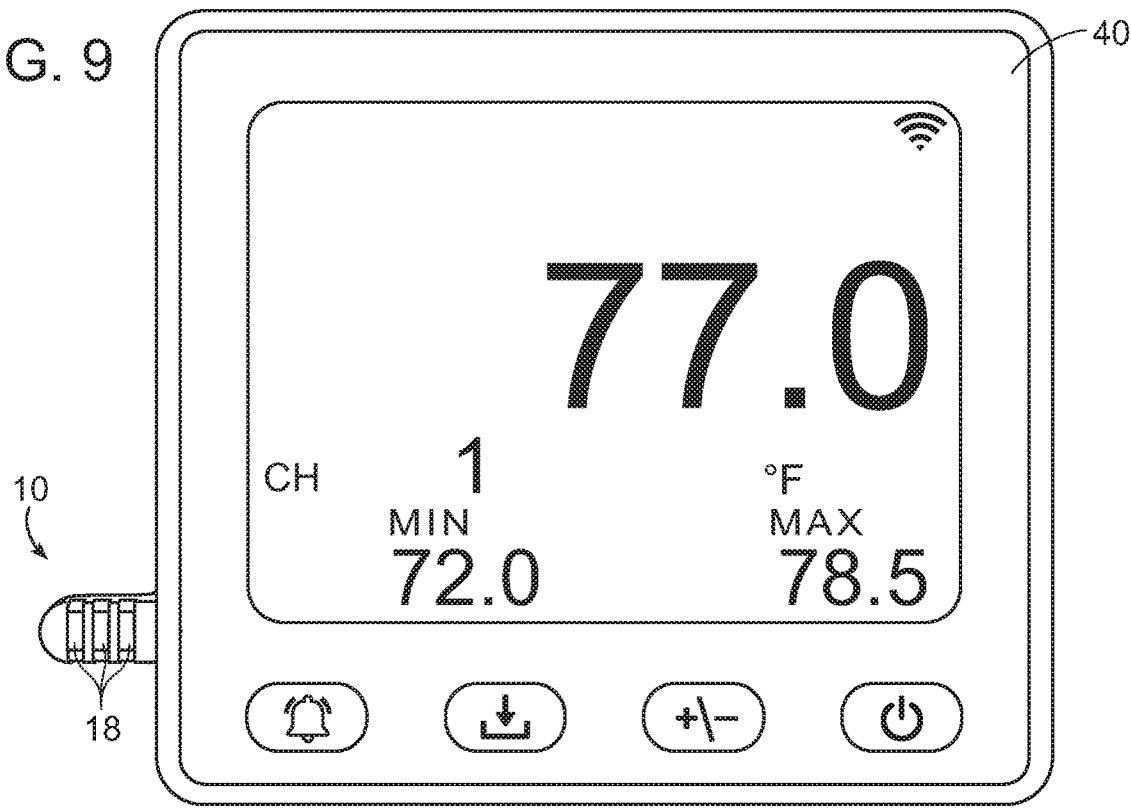
FIG. 9 is a front view of a data unit with a replaceable sensor installed, in accordance with an example embodiment.

The data unit 40 may be a display logger used for measuring temperature, humidity, pressure, etc. with high accuracy. As shown in FIG. 9, the data unit may include an LCD display, and may also have the capability to download and upload data via a USB port (not shown), although other types of data transfer are also possible, such as WiFi and Ethernet connections. In one example, with the data unit, the Dickson DSB (which is a USB display logger), the user may select measurement sample intervals, from 1 second to 24 hour intervals, in 1 or 10 second increments. The data unit 40 measures conditions at the sensor, receiving the data via connector pins 46 that mate with the conductive elements 32 of the sensor housing assembly 10. Collectively, the connector pins 46 comprise a connector 48 that mates with connector 30 of the sensor housing assembly 10. In an example embodiment, connector pins 46 may be male pins that mate with female conductive elements 32. As shown in FIGS. 10A-10C, the connector pins 46 may be recessed in receptacle 42 to protect the pins from bending or other damage when no sensor is installed.

E. Operation of Preferred Embodiment

In use, the protrusion 12 of the housing 11 prevents the sensor housing assembly 10 from being inserted incorrectly into the receptacle 42 of data unit 40. Protrusion 12 also provides a visual and tactile indication of how the sensor housing assembly 10 is to be inserted into receptacle 42. This is desirable because, unlike other connectors, it is not necessary for a user to attempt insertion of the sensor housing assembly into the receptacle only to find out (as indicated by the inability to plug the sensor housing assembly 10 in fully) that the sensor housing assembly 10 was backwards. This phenomenon is well known to anyone who has plugged a USB connector into a receptacle—the lack of a clear visual cue regarding proper orientation often means that a user simply tries to plug a connector in, and upon failure, reverses the connector and tries again.

When inserted, the "smooth" side of housing 11, side 13, faces the inner surface 43 of receptacle 42, while side 14 that includes the protrusion 12 faces outward. As shown in FIGS. 1, 3, and 10B, the protrusion does not extend all the way across side 14, which allows it to fit between blocking tabs 44 in receptacle 42, while blocking tabs 44 will prevent sensor housing assembly 10 from being inserted backward because the protrusion 12 holds the entire side 13 or sensor housing assembly 10 beyond the blocking tabs 44.

In addition to providing a visual and tactile indication of the correct orientation for inserting sensor housing assembly 10 into the receptacle 42 of a data unit 40, using a housing that itself prevents improper insertion allows a symmetrical connectors 30 and 48 to be used, which makes assembly of both the data unit 40 and the sensor housing assembly 10 simpler. As shown in FIGS. 6A and 6B, connector 30 can't be installed backwards on circuit board 20, not because it is somehow prevented, but because there is no "backwards"—the connector can be installed with either side's conductive elements connected to the output of the circuit board traces that constitute the output of the electrical interface circuit 22.

As shown in FIGS. 1, 3, and 4, the connector 30 may substantially occupy, and be positioned within, the opening 16 at first end 15 of housing 11. This allows the connector 30 to mate with a complementary connector 48 of data unit 40, and also helps to prevent the entry of dirt or contaminates into the housing 11. The fit of connector 30 within housing 11 also helps to align connector 30 with connector 48, which prevents connector element mismatch and also prevents or limits the likelihood that any connector elements (32, 46) will be bent when the sensor housing assembly 10 is inserted into data unit 40.

Unless otherwise defined, all technical and scientific terms used herein have the same meaning as commonly understood by one of ordinary skill in the art to which this invention belongs. Although methods and materials similar to or equivalent to those described herein can be used in the practice or testing of the sensor housing assembly, suitable methods and materials are described above. All publications, patent applications, patents, and other references mentioned herein are incorporated by reference in their entirety to the extent allowed by applicable law and regulations. The sensor housing assembly may be embodied in other specific forms without departing from the spirit or essential attributes thereof, and it is therefore desired that the present embodiment be considered in all respects as illustrative and not restrictive. Any headings utilized within the description are for convenience only and have no legal or limiting effect.

What is claimed is:

1. A sensor housing assembly adapted for insertion into a data unit receptacle, comprising:
   a circuit board comprising an electrical interface circuit that accepts a sensor signal and generates an output corresponding to the sensor signal;
   a pressure sensor mounted on the circuit board;
   a connector mounted on the circuit board and conductively coupled to the output, the connector comprising a first plurality of conductive elements; and
   a housing substantially enclosing the circuit board, the housing comprising a first elongated side and a second elongated side opposite the first elongated side, the housing further comprising a first opening at a first end adapted to allow the connector to be mated to a complementary connector of the data unit, the complementary connector having a second plurality of conductive elements configured to mate with the first plurality of conductive elements;
   wherein the housing comprises a second opening at a second end for receiving a tube for carrying a pressure to the pressure sensor; and
   wherein the first elongated side is adapted to contact a surface of the data unit receptacle and wherein the second elongated side includes a protrusion to prevent the housing from being inserted with the second elongated side adjacent to the surface.

2. The sensor housing assembly of claim 1, wherein the first elongated side and the second elongated side are parallel to each other.

3. The sensor housing assembly of claim 1, wherein the housing surrounds the connector on four sides.

4. The sensor housing assembly of claim 1, wherein the first plurality of conductive elements are symmetrically arranged.

5. The sensor housing assembly of claim 1, wherein the first plurality of conductive elements are female.

6. The sensor housing assembly of claim 1, wherein the protrusion comprises a curved surface.

7. The sensor housing assembly of claim 1, wherein the protrusion comprises a cylindrically-shaped surface.

* * * * *